(12) United States Patent
Berger et al.

(10) Patent No.: US 11,423,965 B2
(45) Date of Patent: Aug. 23, 2022

(54) WORD LINE DECODER MEMORY ARCHITECTURE

(71) Applicant: Integrated Silicon Solution, (Cayman) Inc., Grand Cayman (KY)

(72) Inventors: Neal Berger, Cupertino, CA (US); Susmita Karmakar, Fremont, CA (US); Benjamin Louie, Fremont, CA (US)

(73) Assignee: Integrated Silicon Solution, (Cayman) Inc., Grand Cayman (KY)

( * ) Notice: Subject to any disclaimer, the term of this patent is extended or adjusted under 35 U.S.C. 154(b) by 0 days.

(21) Appl. No.: 16/831,592

(22) Filed: Mar. 26, 2020

(65) Prior Publication Data
US 2020/0227102 A1 Jul. 16, 2020

Related U.S. Application Data

(63) Continuation of application No. 16/134,869, filed on Sep. 18, 2018, now Pat. No. 10,699,761.

(51) Int. Cl.
| | |
|---|---|
| *G11C 8/08* | (2006.01) |
| *G11C 11/16* | (2006.01) |
| *G11C 8/10* | (2006.01) |
| *G11C 5/14* | (2006.01) |

(52) U.S. Cl.
CPC ............ *G11C 8/08* (2013.01); *G11C 5/14* (2013.01); *G11C 8/10* (2013.01); *G11C 11/1657* (2013.01); *G11C 11/1659* (2013.01)

(58) Field of Classification Search
CPC .... G11C 8/08; G11C 8/10; G11C 5/14; G11C 11/1657; G11C 11/1659
See application file for complete search history.

(56) References Cited

U.S. PATENT DOCUMENTS

| | | | | | |
|---|---|---|---|---|---|
| 5,982,211 | A | * | 11/1999 | Ko ........................ | H03K 17/693 327/202 |
| 6,501,315 | B1 | * | 12/2002 | Nguyen ................. | H03K 3/012 327/203 |
| 6,563,357 | B1 | * | 5/2003 | Hsu ................... | H03K 3/356113 327/212 |
| 7,443,223 | B2 | * | 10/2008 | Bajkowski ....... | H03K 3/356121 326/68 |
| 9,954,527 | B2 | * | 4/2018 | Wilson ........... | H03K 19/018528 |

* cited by examiner

*Primary Examiner* — Vanthu T Nguyen

(57) ABSTRACT

A clocked driver circuit can include a level shifter latch and a driver. The level shifter latch can be configured to receive an input signal upon a clock signal and generate a level shifted output signal. The driver can be configured to receive the level shifted output signal from the level shifter and drive the output signal on a line. The signal levels of the output signal can be greater than the signal level of the input signal.

12 Claims, 7 Drawing Sheets

WORD LINE DECODER MEMORY ARCHITECTURE

CROSS-REFERENCE TO RELATED APPLICATIONS

This is a Divisional of U.S. patent application Ser. No. 16/134,869 filed Sep. 18, 2018, which is incorporated herein in its entirety.

BACKGROUND

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing systems is computing device readable media, commonly referred to as memory.

Data and instructions used by the computing system can be stored in and retrieved from one or more memory devices. When reading or writing to memory a corresponding read or write voltage potential is applied to a given word line based upon a decoded memory address. Referring to FIG. 1, a block diagram of a word line decoder and driver path architecture, according to the conventional art, is shown. The word line decoder and driver path 100 can include a plurality of flip flops 110 configured to latch a received address 120 upon receipt of a clock signal (e.g., rising or falling edge of a system clock signal) 130. A set of address buffers 140 can be configured to buffer the latched address bits from the flip flops 110. A word line pre-decoder 150 can be configured to partially decode the address in the address buffer 140. In one implementation, the word line pre-decoder 150 can be configured to decode a block, bank and/or the like portion of the memory from the address. A word line decoder 160 can be configured to decode a given word line from the partially decoded address from the word line pre-decoder 150. A level shifter 170 can be configured to shift the relatively low voltage potential signal propagating through the flip flops 110, address buffer 140, word line pre-decoder 150 and word line decoder 160 to an appropriate high voltage potential signal. A high voltage driver 180 can drive the word line 190 with the appropriate high voltage potential signal from the level shifter 170 during a read, write or erase operation. The combination of the flip flops 110, address buffers 140, word line pre-decoder 150 and word line decoder 160 can comprise an address decoder circuit, and the combination of the level shifter 170 and high voltage driver 180 can comprise a word line driver circuit.

The propagation delay through the word line decoder and driver path can be the sum of the clock-data out set up time of the flip flops 110 $T_{C \rightarrow Q}$, the propagation delay in the address buffers 140 $T_{AB}$, the propagation delay through the word line pre-decoder 150 $T_{WPD}$, the propagation delay through the word line decoder 160 $T_{WD}$ and the propagation delay through the level shifter 170 and high voltage driver 180 $T_{WDR}$. However, as computing devices continue to evolve there is a continuing need for faster memory devices. One possible way to increase the speed of the memory device is to reduce the propagation delay through the word line decoder and driver path. Therefore, there is a need for an improved word line decoder and driver path architecture.

SUMMARY

The present technology may best be understood by referring to the following description and accompanying drawings that are used to illustrate aspects of the present technology that are directed toward clocked driver circuits.

In one embodiment, a memory device can include a level shifter latch and a driver. The level shifter latch can be configured to receive a plurality of decoded address signals upon a first state of a clock signal and to output a plurality of word line signals. In one implementation, the clock signal can be a short pulse clock signal. The short pulse clock signal can be based on a rising edge of a system clock, and the pulse width of the short pulse clock signal can be shorter than the pulse width of the system clock. The decoded address signals can include a first and second state and the word line signals can include a third and fourth state, wherein a potential difference between the third and fourth states is greater than a potential difference between the first and second states. The driver can be configured to receive the plurality of word line signals and drive corresponding word lines with the plurality of word line signals.

In another embodiment, a device can include a plurality of inverters, a plurality of transmission gates, a latch and an inverting driver. A first inverter can include an input configured to receive a signal. A second inverter can include an input coupled to an output of the first inverter. The first and second inverters can operate from a first supply potential. A first transmission gate can include a control terminal configured to receive a clock signal and an input coupled to the output of the first inverter. A second transmission gate can include a control terminal configured to receive the clock signal and an input coupled to the output of the second inverter. The latch can include a third inverter cross-coupled to a fourth inverter. An input of the third inverter can be coupled to an output of the first transmission gate and an output of the fourth inverter. An input of the fourth inverter can be coupled to an output of the second transmission gate and an output of the third inverter. The inverting driver can include an input coupled to an output of the third inverter and an output configured to output a drive signal. The latch and inverting driver can operate from a second supply potential that is greater than the first supply potential.

In yet another embodiment, a memory device can include a memory cell array, an address buffer, an address decoder, a level shifter latch and a word line driver. The address buffer can be configured to buffer a plurality of address signals. The address decoder circuit can be configured to receive the buffered plurality of address signals and output a plurality of decoded address signals. The level shifter latch can be configured to receive the plurality of decoded address signals upon a first state of a clock signal and to output a plurality of word line signals. The address decoder circuit can be configured to operate from a first supply potential, while the level shifter latch can be configured to operate from a second supply potential that is greater than the first supply potential. The word line driver can be configured to receive the plurality of word line signals and drive the plurality of word line signals on word lines of the memory cell array.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Aspects of the present technology are illustrated by way of example and not by way of limitation, in the figures of the accompanying drawings and in which like reference numerals refer to similar elements and in which.

DETAILED DESCRIPTION

Figure 1:
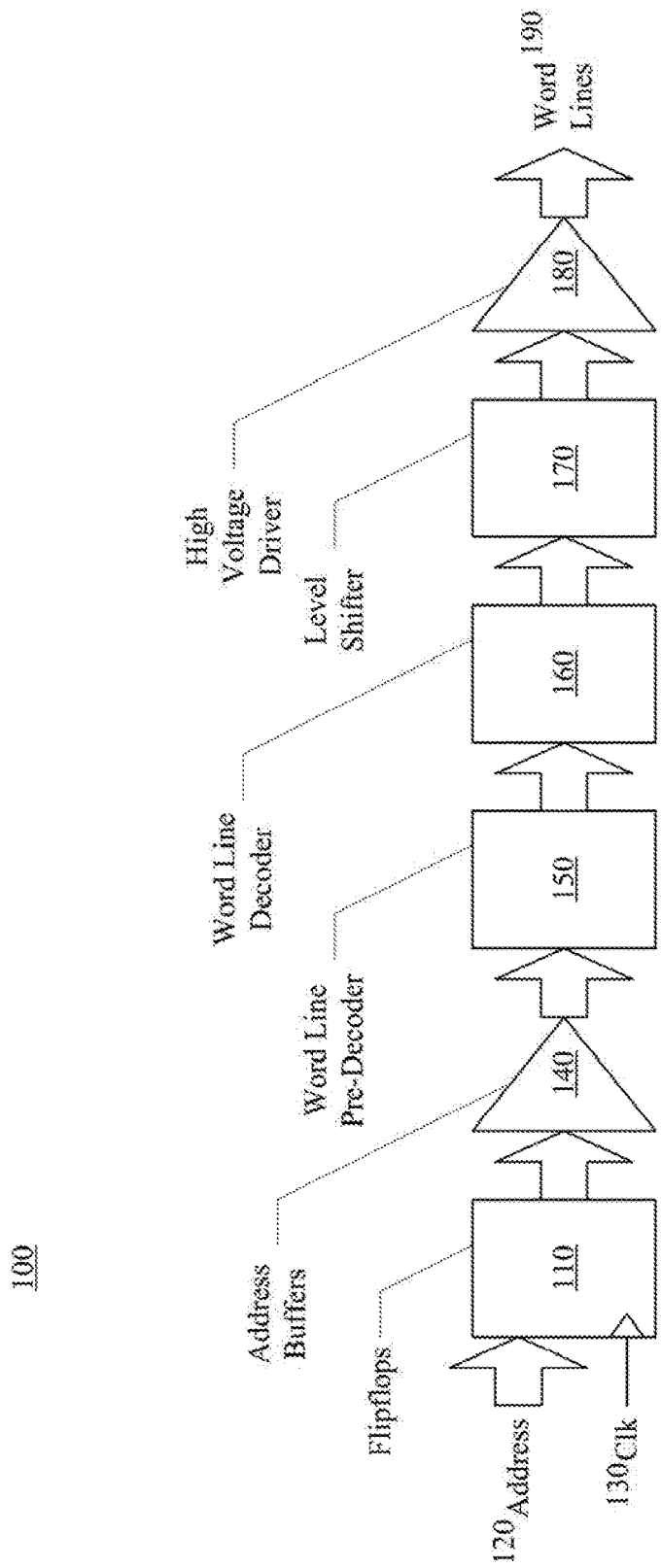
FIG. 1 shows a block diagram of a word line decoder and driver path architecture, according to the conventional art.

Reference will now be made in detail to the aspects of the present technology, examples of which are illustrated in the accompanying drawings. While the present technology will be described in conjunction with these aspects, it will be understood that they are not intended to limit the invention to these aspects. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some aspects of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to aspects of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 2:
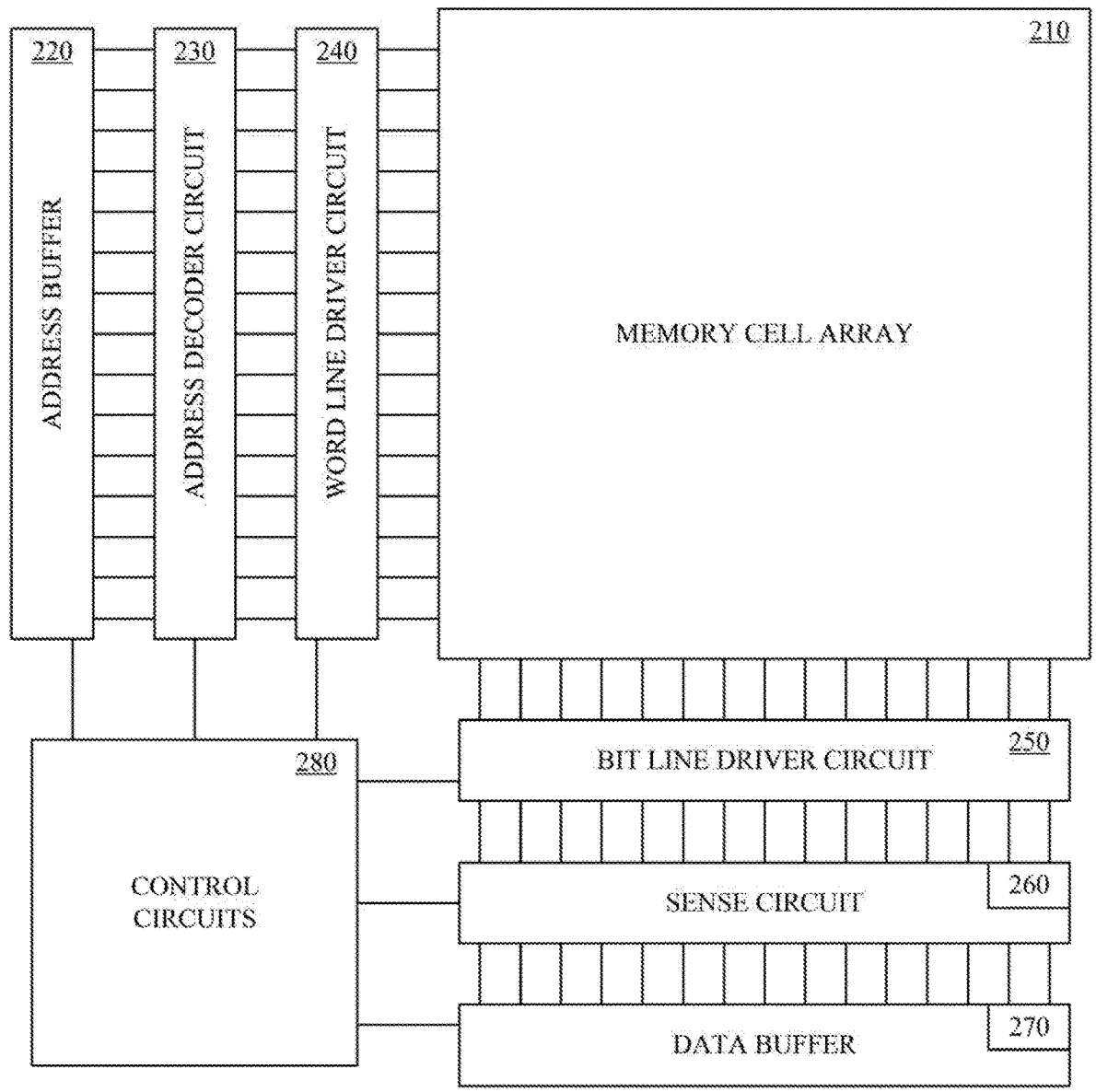
FIG. 2 shows a block diagram of a memory device, in accordance with aspects of the present technology.

Referring now to FIG. 2, a block diagram of a memory device, in accordance with aspects of the present technology, is shown. The memory device 200 can be a Magnetoresistive Random Access Memory (MRAM), Spin Torque Magnetoresistive Random Access Memory (ST-MRAM), a Phase Change Memory (PCM), a stackable cross-gridded Phase Change Memory, Resistive Random Access Memory (ReRAM), or similar memory device. In some aspects, the memory device 200 can include a memory cell array 210, an address buffer 220, an address decoder circuit 230, a word line driver circuit 240, a bit line driver circuit 250, a sense circuit 260, a data buffer 270, and control circuit 280. The memory device 200 can also include other well-known circuits that are not necessary for an understanding of the present technology and therefore are not discussed herein.

In some aspects, the memory cell array 210 can include a plurality of memory cells organized in rows and columns, with sets of word lines, bit lines and optionally source lines spanning the array of cells throughout the chip. The address buffer 220 can be configured to receive and buffer a plurality of address signals. The address decoder 230 can receive the plurality of address signals buffered by the address buffer 220 and output a plurality of decoded address signals. The address decoder 230 can map a given memory address to a particular row of memory cells in the array.

In some aspects, the output of the address decoder 230 can be input to the word line driver 240 upon a first state of a clock signal. In one implementation, the word line driver 240 can receive the plurality of decoded address signals upon receipt of a high state of a clock signal. The word line driver 240 can level shift the received decoded address signals that include one or more of a first potential voltage and a second potential voltage to word line drive signals that include one or more of a third potential voltage and a fourth potential voltage, and latch the plurality of word line drive signals that include the one or more of the third potential voltage and the fourth potential voltage. The potential difference between the third and fourth potential voltages can be greater than the potential difference between the first and second potential voltages. The output of the word line driver 240 can drive the word lines to select a given word line of the array 210 based on the plurality of word line drive signals.

In some aspect, the bit line driver 250 and the sense circuit 260 utilize the bit lines, and/or optionally the source lines, of the array 210 to read from and write to memory cells of a selected word line of the array 210. The data read from and written to the memory cells can be buffered in the data buffer 270. The control circuit 280 can generate one or more control signals for the control of one or more of the address buffer 220, the address decoder circuit 230, the word line driver circuit 240, the bit line driver circuit 250, the sense circuit 260, the data buffer 270.

Figure 3:
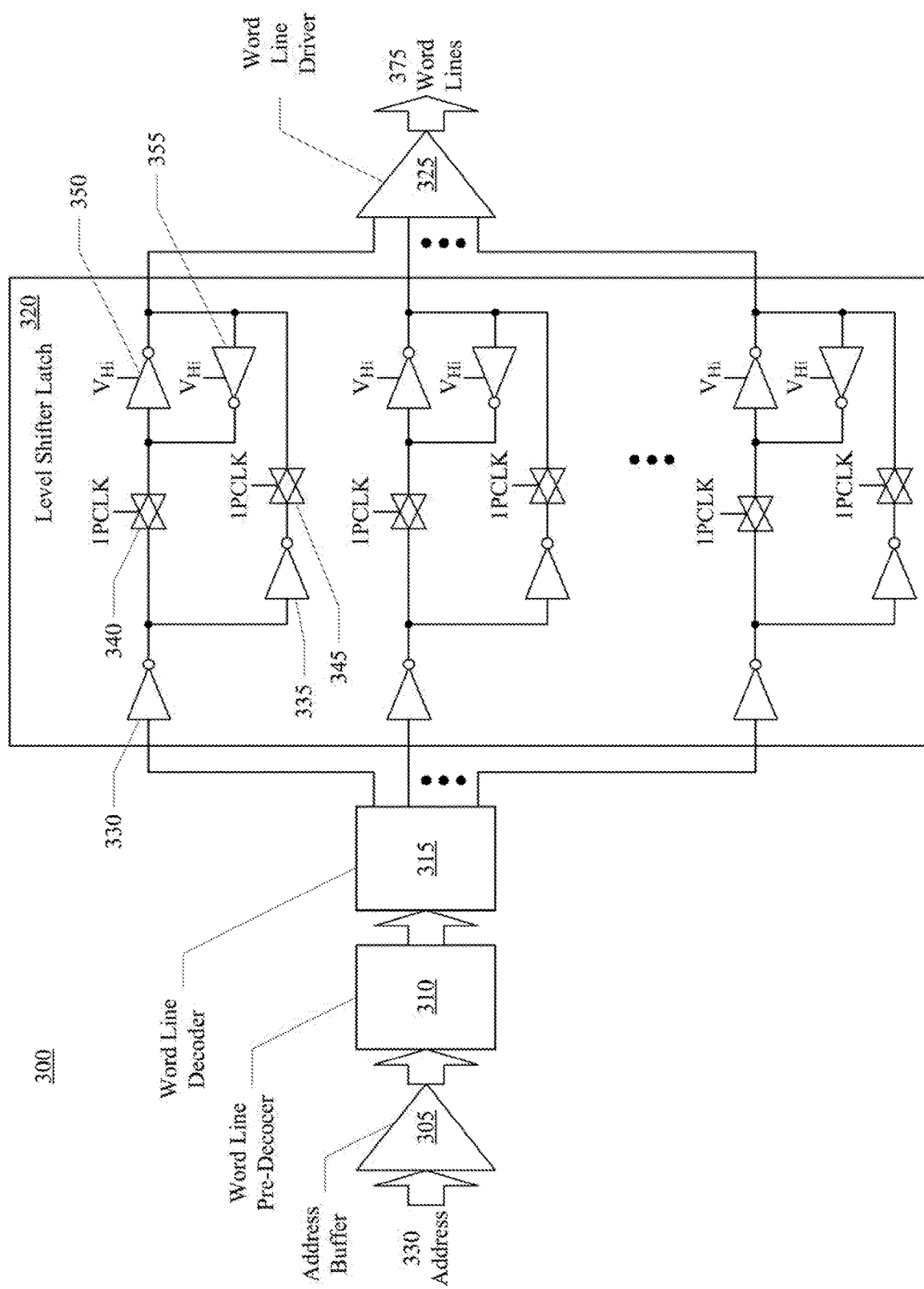
FIG. 3 shows a block diagram of a word line decoder and driver path architecture, in accordance with aspects of the present technology.

Referring now to FIG. 3, a block diagram of a word line decoder and driver path architecture, in accordance with aspects of the present technology, is shown. In some aspects, the word line decoder and driver path architecture 300 can include an address buffer 305, a word line pre-decoder 310, a word line decoder 315, a level shifter latch 320, and a word line driver 325. The address buffer 305 can be configured to receive and buffer a plurality of address signals 330. The word line pre-decoder 310 can be configured to receive the buffered plurality of address signals and output partially decoded address signals. In one implementation, the word line pre-decoder 310 can be configured to decode a block, bank and/or the like portion of the memory from the buffered plurality of address signals. The word line decoder 315 can be configured to receive the partially decoded address signal and output a plurality of decoded address signals. In one implementation, the word line decoder 315 can be configured to decode a given word line from the buffered plurality of address signals. The level shifter latch 320 can be configured to receive the plurality of decoded address signals upon a first state of a clock signal and to output a plurality of word line signals. In one implementation, the plurality of decoded address signals can include one or more of a first potential voltage and a second potential voltage. The plurality of word line signals can include one or more of a third potential voltage and a fourth potential voltage, wherein a potential difference between the third potential voltage and the fourth potential voltage is greater than a potential difference between the first potential voltage and the second potential voltage. For example, the decoded address signals can be signals having either a ground potential state (e.g., low logic state) or a low supply voltage potential (e.g., high logic state). The word line signals can be signals having either a ground potential state (e.g., low drive state) or a high supply voltage potential (e.g., high drive state).

In some aspects, the level shifter latch 320 can include, for each of the plurality of word lines, a first inverter 330, a second inverter 335, a first transmission gate 340, a second transmission gate 345, a third inverter 350, and a fourth inverter 355. The first inverter 330 can including an input configured to receive a first one of the plurality of decoded address signals. The second inverter 335 can include an input coupled to an output of the first inverter 330. The first transmission gate 340 can include a first terminal coupled to the output of the first inverter 330, a second terminal configured to receive a short pulse clock signal (1PCLK), and a third terminal. The second transmission gate 345 can include a first terminal coupled to an output of the second inverter 335, a second terminal configured to receive the short pulse clock signal (1PCLK), and a third terminal. The third inverter 350 can include an input coupled to the third terminal of the first transmission gate 340, power terminals coupled between a high voltage source ($V_{Hi}$), and an output terminal configured to output a first one of the plurality of word line signals. The fourth inverter 355 can include an input coupled to the third terminal of the second transmission gate 345 and the output of third inverter 350, power terminals coupled between the high voltage source (Vii), and an output terminal coupled to the input of the third inverter 350.

Figure 4:
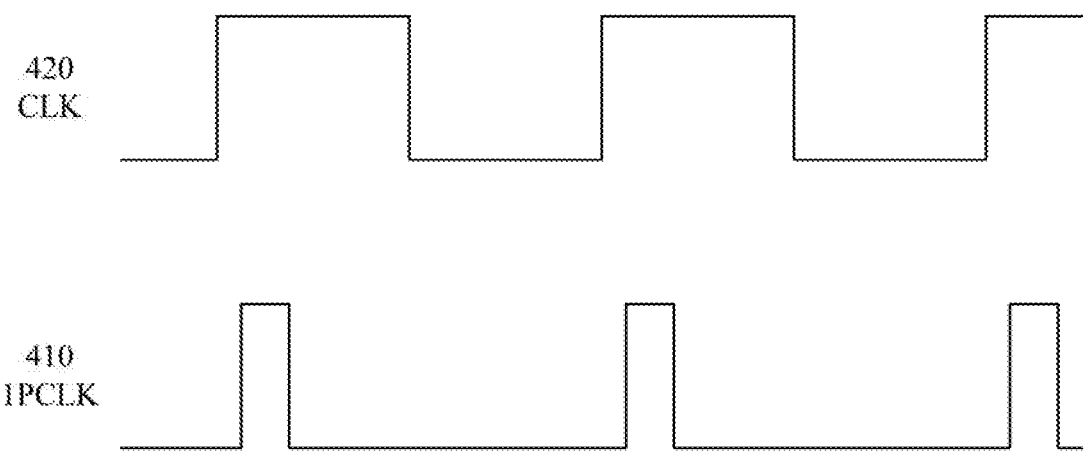
FIG. 4 shows a timing diagram illustrating a short clock pulse utilized in the word line decoder and driver path architecture, in accordance with aspect of the present technology.

In some aspects, the third and fourth inverter 350, 355 form a bi-stable latch with two stable states. The first transmission gate 340 can pass a complement of the decoded address signal to a first terminal of the bi-stable latch during a given state (e.g., logic high) of the short clock pulse signal, while the second transmission gate 345 can pass the decoded signal to a second terminal of the bi-stable latch. The short pulse clock signal (1PCLK) 410 can be generated based on a rising edge of a system clock (CLK) 420, as illustrated in FIG. 4. The short pulse clock signal at the gate of the first and second transmission gates 340, 345 can transfer the address to the third and fourth inverters 350, 355 at the rising edge of the system clock (CLK) 420. The pulse width of the short pulse clock signal (1PCLK) 410 can extend the hold time of the address. The pulse width of the short pulse clock signal (1PCLK) 410 should be less than the pulse width of the system clock (CLK) 420. The output of the level shifter latch 320 can be taken at the second terminal of the bi-stable latch.

In one implementation, when the decoded address signal is in a logic low state, the first inverter 330 generates a logic high state at its output and the second inverter 335 generates a logic low state at its output. The first pass gate 340 passes the logic high state from the first inverter 330 to an input of the third inverter 350 when the short pulse clock signal (1PCLK) is in a given state (e.g., logic high state), and the second pass gate 345 passes the logic low state from the second inverter 335 to an input of the fourth inverter 355 when the short pulse clock signal (1PCLK) is in the given state. The logic high state at the input to the third inverter 350 and the logic low state at the input to the fourth inverter 355 will drive the output of the bi-stable latch to the low drive state. When the decoded address signal is in a logic high state, the first inverter 330 generates a logic low state at its output and the second inverter 335 generates a logic high state at its output. The first pass gate 340 passes the logic low state from the first inverter 330 to an input of the third inverter 350 when the short pulse clock signal (1PCLK) is in the given state (e.g., logic high state), and the second pass gate 345 passes the logic high state from the second inverter 335 to an input of the fourth inverter 355 when the short pulse clock signal (1PCLK) is in the given state. The logic low state at the input to the third inverter 350 and the logic high state at the input to the fourth inverter 355 will drive the output of the hi-stable latch to the high drive state. The logic level of the decoded address signal (e.g., logic low or logic high) is shifted to the drive level of the word line signal (e.g., low drive state or high drive state) as a result of the high voltage source ($V_{Hi}$) supplied to the third and fourth inverters 350, 355 of the bi-stable latch. The level shifted word line signals can be output by the level shifter latch 320. The word line driver 325 can be configured to receive the plurality of word line signals and drive the plurality of word line signals on corresponding ones of the plurality of word lines 375.

Figure 5:
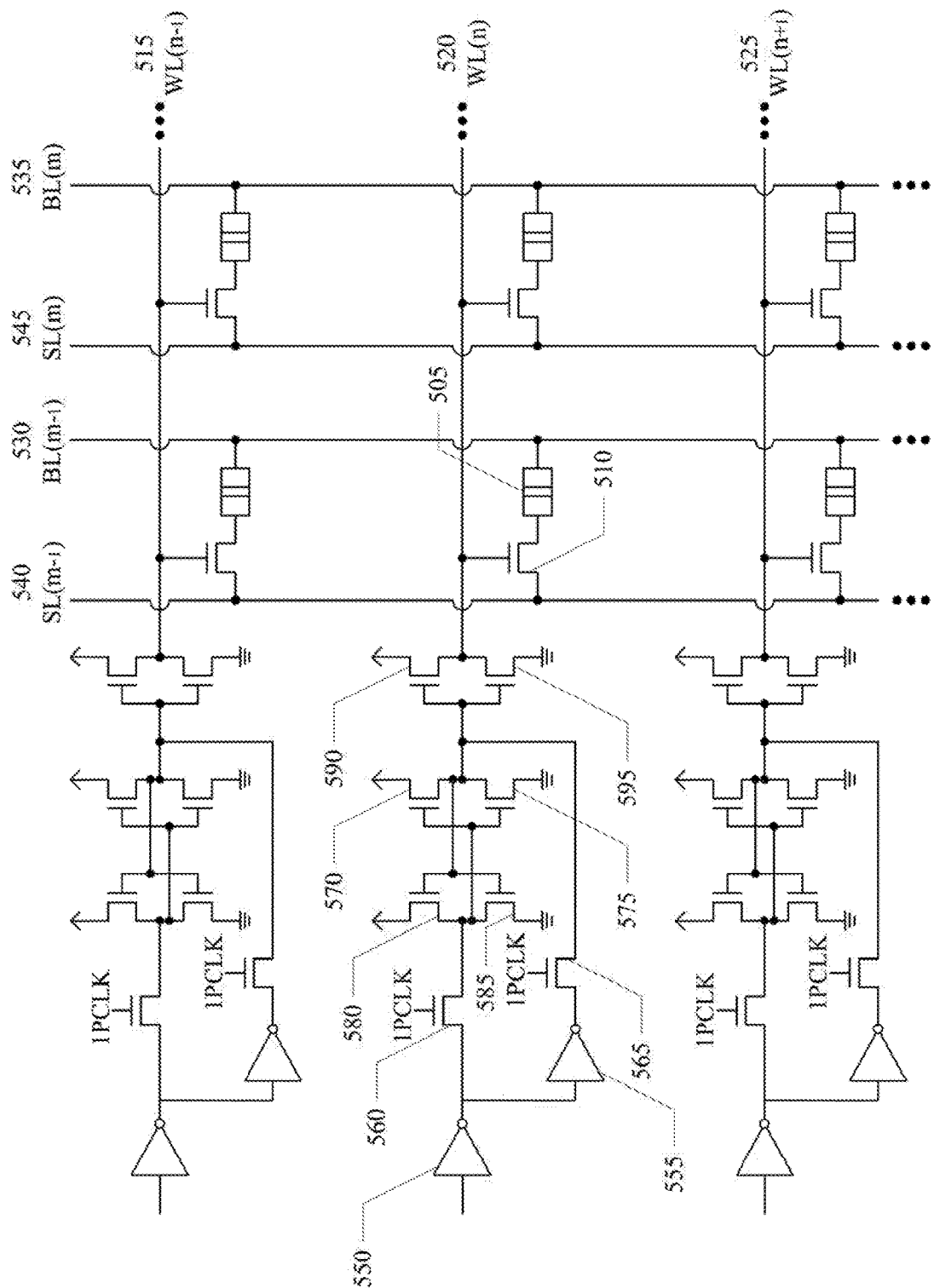
FIG. 5 shows a block diagram of a word line driver in combination with a memory cell array, in accordance with aspects of the present technology.

Referring now to FIG. 5, a block diagram of a word line driver in combination with a memory cell array, in accordance with aspects of the present technology, is shown. The memory cell array can be any one of a number of memory cell architectures, such as NAND Flash memory, Magnetoresistive Random Access Memory (MRAM), or the like that can benefit from a fast word line drive circuit due to characteristics such as relatively high capacitive word lines. While aspects of the present technology are described herein in conjunction with MRAM memory cell arrays, it will be understood that they are not intended to be limited thereto.

In some aspects, the MRAM memory cell array can include a plurality of memory cells 505, 510, a plurality of word lines 515-525, a plurality of bit lines 530-535, and a plurality of source lines 540-545. The word lines 515-525 of the memory cell array can be organized along rows of the array. The bit lines 530-535 and the source lines 540-545 can be organized along columns of the array. Each memory cell 505, 510 can include a Magnetic Tunneling Junction (MTJ) cell 505 and an access transistor 510. In one implementation, the MTJ cells can be Spin Torque Magnetoresistive memory cells. The gates of the access transistors 510 arranged along rows of the array can be coupled to a respective word line 520. The sources of the access transistors 510 arranged along columns of the array can be coupled to respective source lines 540. A free magnetic layer of the MTJ cell 505 arranged along columns of the array can be coupled to respective bit lines 530.

In some aspects, the magnetic polarity of the free layer of the MTJ cell 505, and corresponding logic state of the cell, can be changed to one of two states depending upon the direction of current flowing through the MTJ cell 505. For example, a logic '0' state can be written to the memory cell 505, 510 by biasing the respective bit line 530 at a bit line write potential (e.g., $V_{BLW}$), biasing the respective source line 540 at a ground potential, and driving the respective word line 520 at a word line write potential (e.g., $V_{WLW}=V_{Hi}$). A logic '1' state can be written to the given memory cell 505, 510 by biasing the respective bit line 530 at a ground potential, biasing the respective source line 540 at a source line write potential (e.g., $V_{SLW}$), and driving the respective word line 520 at the word line write potential (e.g., $V_{WTW}=V_{Hi}$). The state of the memory cell 505, 510 can be read by biasing the respective bit line 530 at a bit line read potential (e.g., $V_{BLR}$), biasing the respective source line 540 at a ground potential, driving the respective word line 520 at a word line read potential ($V_{WLR}=V_{Hi}$), and sensing the resulting current on the respective bit line 530.

In another example, a logic '0' state can be written to a given memory cell 505, 510 by biasing the respective bit line 530 at a bit line write potential (e.g., $V_{BLW}$), biasing the respective source line 540 at a ground potential, and driving the respective word line 520 at a word line write potential (e.g., $V_{WLW}=V_{Hi}$). A logic '1' state can be written to the given memory cell 505, 510 by biasing the respective bit line 530 at a ground potential, biasing the respective source line 540 at a source line write potential (e.g., $V_{SLW}$), and driving the respective word line 520 at the word line write potential (e.g., $V_{WLW}=V_{Hi}$). The state of the memory cell 505, 510 can be read by biasing the respective bit line 530 at a ground potential, biasing the respective source line 540 at a source line read potential (e.g., $V_{SLR}$), driving the respective word line 520 at a word line read potential (e.g., $V_{WLR}=V_{Hi}$), and sensing the resulting current on the respective source line 540.

In some aspects, the word line driver can include, for each of a plurality of word lines, a first inverter 550, a second inverter 555, a first transmission gate 560, a second transmission gate 565, a level shifter latch 570-585, and an inverting driver 590, 595. The first inverter 550 can include an input configured to receive a decoded address signal. The second inverter 555 can include an input coupled to an output of the first inverter 550. The first and second inverters 550, 555 can operate from a first supply potential.

In some aspects, the first transmission gate 560 can include a control terminal configured to receive a short pulse clock signal (1PCLK) and an input coupled to the output of the first inverter 550. The second transmission gate 565 can include a control terminal configured to receive the short pulse clock signal (1PCLK) and an input coupled to the output of the second inverter 555. Again, the short pulse clock signal (1PCLK) can be generated based on the rising edge of a system clock (CLK). In one implementation, the first and second transmission gates 560, 565 can be first and second Metal Oxide Semiconductor Field Effect Transistors (MOSFETs) respectively. MOSFETs can be either p-channels MOSFETs or n-channels MOSFETs. The first MOSFET 560 can include a gate configured to receive the short pulse clock signal (1PCLK), a source coupled to the output of the first inverter 550, and a drain coupled to the input of the first latch inverter 570, 575. The second MOSFET 565 can include a gate configured to receive the short pulse clock signal (1PCLK), a source coupled to the output of the second inverter 555, and a drain coupled to an input of the second latch inverter 580, 585. In one implementation, first and second MOSFETs 560, 565 can be n-MOSFETs. In other implementations, it may be possible to use transmission gates or buffers in place of the first and second MOSFETs 560, 565.

In some aspects, the level shifter latch 570-585 can include a first latch inverter 570, 575 cross coupled to a second latch inverter 580, 585. An input of the first latch inverter 570, 575 can be coupled to an output of the first clocked transmission gate 560 and an output of the second latch inverter 580, 585. The input of the second latch inverter 580, 585 can be coupled to an output of the second clocked transmission gate 565 and an output of the first latch inverter 570, 575. The level shifter 570-585 can operates from a second supply potential that is greater than the first supply potential. In one implementation, the first latch inverter 570, 575 includes a first p-MOSFET 570 and a first n-MOSFET 575. A gate of the first p-MOSFET 570 and a gate of the first n-MOSFET 575 can be coupled together as the input of the first latch inverter 570, 575, a drain of the first p-MOSFET 570 and a drain of the first n-MOSFET 575 can be coupled together as the output of the first latch inverter 570, 575, and a source of the first p-MOSFET 570 and the source of the first n-MOSFET 575 can be coupled between the second supply potential. The second latch inverter 580, 585 can include a second p-MOSFET 580 and a second n-MOSFET 585. A gate of the second p-MOSFET 580 and a gate of the second n-MOSFET 585 can be coupled together as the input of the second latch inverter 580, 585, a drain of the second p-MOSFET 580 and a drain of the second n-MOSFET 585 can be coupled together as the output of the second latch inverter 580, 585, and a source of the second p-MOSFET 580 and the source of the second n-MOSFET 585 can be coupled between the second supply potential. It should also be appreciated that the drain and source of MOSFET devices are generally interchangeable, such that the description of the sources and drains of MOSFET herein can be interchanged.

In some aspects, the inverting driver 590, 595 can include an input coupled to an output of the first latch inverter 570, 575 and the output of the second clocked transmission gate 565, and an output coupled to a word line (WL(n)) 520. The inverting driver 590, 595 can operate from the second supply potential. In one implementation, the inverting driver 590, 595 can include a p-MOSFET 590 and a n-MOSFET 595. A gate of the p-MOSFET 590 and the gate of the n-MOSFET 595 can be coupled together as the input of the inverting driver 590, 595, a drain of the p-MOSFET 590 and a drain of the n-MOSFET 595 can be coupled together as the output of the inverting driver 590, 595, and a source of the p-MOSFET 590 and a source of the n-MOSFET 595 can be coupled between the second supply potential.

In some aspects, the first inverter 550, the second inverter 555, the first transmission gate 560, the second transmission gate 565, the level shifter 570-585, and the inverting driver 590, 595 of the word line driver can drive the word line 520 when the word line 520 is selected by a decoded address signal. For example, when the decoded address signal is in a logic low state, the first inverter 550 generates a logic high state at its output and the second inverter 555 generates a logic low state at its output. The first transmission gate 560 passes the logic high state from the first inverter 550 to an input of the first latch inverter 570, 575 when the short pulse clock signal (1PCLK) is in a given state (e.g., logic high state), and the second transmission gate 565 passes the logic low state from the second inverter 555 to an input of the second latch inverter 580, 585 when the short pulse clock signal (1PCLK) is in the given state. The logic high state at the input to the first latch inverter 570, 575 and the logic low state at the input to the second latch inverter 580, 585 will drive the output of the bi-stable level shifter latch 570-585 to the low drive state. In response to the low drive state from the level shifter latch 570-585, the inverting driver 590, 595 generates a high drive state to drive the given word line 520 to select the memory cells 505, 510 on the given word line 520. When the decoded address signal is in a logic high state, the first inverter 550 generates a logic low state at its output and the second inverter 555 generates a logic high state at its output. The first pass gate 560 passes the logic low state from the first inverter 550 to an input of the first latch inverter 570, 575 when the short pulse clock signal (1PCLK) is in the given state (e.g., logic high state), and the second pass gate 565 passes the logic high state from the second inverter 555 to an input of the second latch inverter 580, 585 when the short pulse clock signal (1PCLK) is in the given state. The logic low state at the input to the first latch inverter 570, 575 and the logic high state at the input to the second latch inverter 580, 585 will drive the output of the bi-stable level shifter latch 570-585 to the high drive state. The logic level of the decoded address signal (e.g., logic low or logic high) is shifted to the drive level of the word line signal (e.g., low drive state or high drive state) as a result of the high voltage source ($V_{Hi}$) supplied to the first and second latch inverters of the bi-stable level shifter latch 570-585. In response to the high drive state from the level shifter latch 570-585, the inverting driver 590-595 generates a low drive state on the given word line 520 to de-select the memory cells 505, 510 on the given word line 520.

Figure 6:
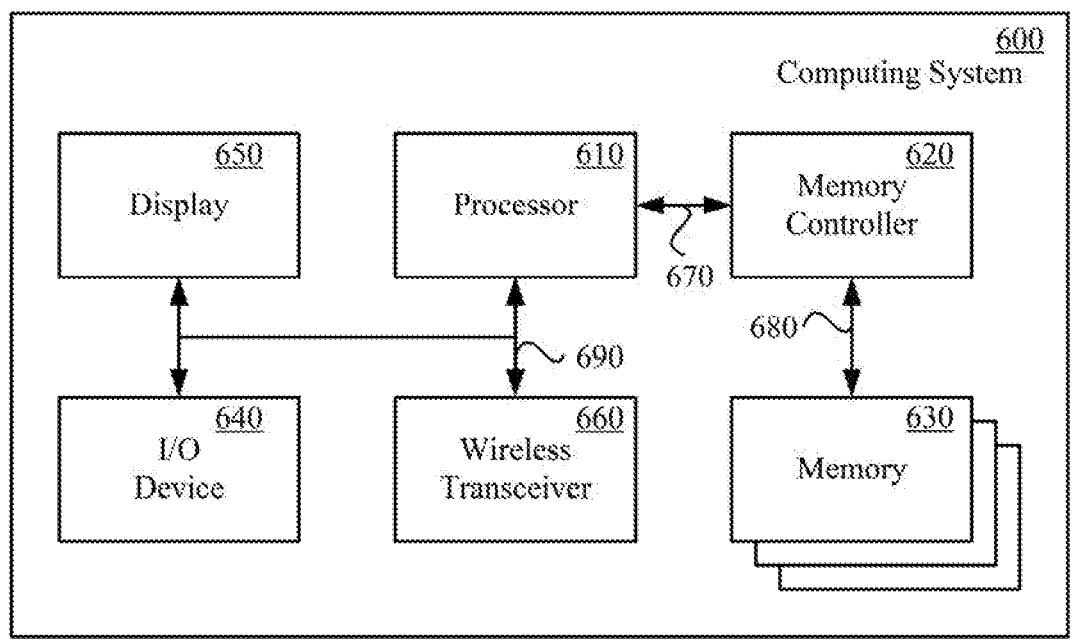
FIG. 6 shows a block diagram of a computing system including a memory device, in accordance with aspects of the present technology.

Referring now to FIG. 6, a block diagram of a computing system including a memory device, in accordance with aspects of the present technology, is shown. The computing system 600 can, for example, be a cellular telephone, smart phone, e-reader, tablet personal computer (PC), laptop PC, desktop PC, gaming console, workstation, server computer, or other similar computing device. The computing system 600 can include one or more processors 610, one or more memory controllers 620, one or more memory devices 630, and one or more input/output devices 640-660 communicatively coupled together by one or more buses 670-690. The one or more input/output devices 640 can include, for example, a display 650, a wireless transceiver 660 and the like. The computing system 600 can also include other sub-circuits that are not necessary for an understanding of the present technology and therefore are not discussed herein.

The one or more memory controllers 620 can be operable to control access to data stored in the one or more memory devices 630 for use by the one or more processors 610, one or more input/output devices 640 and/or other sub-systems of the computing system 600. The one or more memory controllers 620 can generate commands for reading and writing of data in the one or more memory devices 630 in response to memory requests received from the one or more processors 610, one or more input/output devices 640 and/or other sub-systems. One or more of the memory devices 630 can include the word line driver circuit as described herein with regard to FIGS. 2-4.

Figure 7:
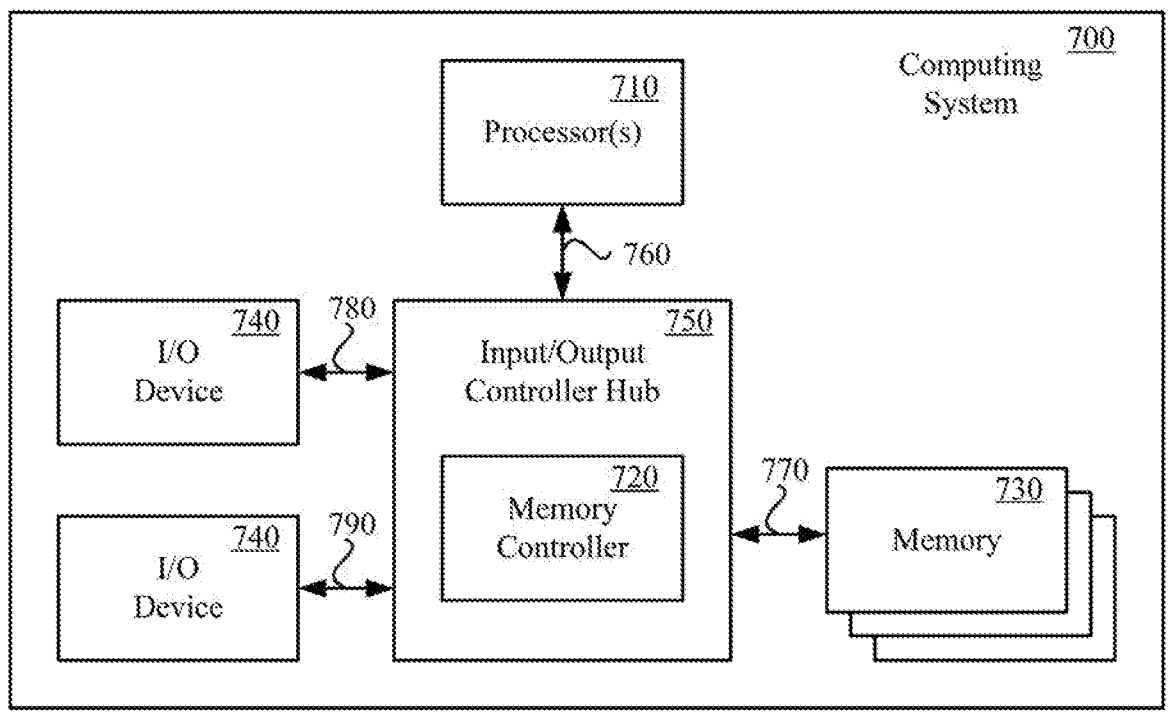
FIG. 7 shows a block diagram of a computing system including a memory device, in accordance with aspects of the present technology.

Referring now to FIG. 7, a block diagram of a computing system including a memory device, in accordance with aspects of the present technology, is shown. The computing system 700 can, for example, be a cellular telephone, smart phone, e-reader, table personal computer (PC), laptop PC, desktop PC, gaming console, workstation, server computer, or other similar computing device. The computing system 700 can include one or more processors 710, one or more memory controllers 720, one or more memory devices 730, and one or more input/output devices 740 that can be communicatively coupled together by one or more input/output controller hubs 750 through one or more buses 760-790. The computing system 700 can also include other sub-circuits that are not necessary for an understanding of the present technology and therefore are not discussed herein.

The one or more memory controllers 720 can be integral to one or more other sub-circuits such as the one or more input/output controller hubs 750 and/or memory devices 730, or can be implemented as a separate sub-circuit. The one or more memory controllers 720 can be operable to control access to data stored in the one or more memory devices 730 for use by the one or more processors 710, one or more input/output devices 740 and/or other sub-systems of the computing system 700. The one or more memory controllers 720 can generate commands for reading and writing of data in the one or more memory devices 730 in response to memory requests received from the one or more processors 710, one or more input/output devices 740 and/or other sub-systems. One or more of the memory devices 730 can include the word line driver circuit as described herein, with regard to FIGS. 2-4.

Figure 8:
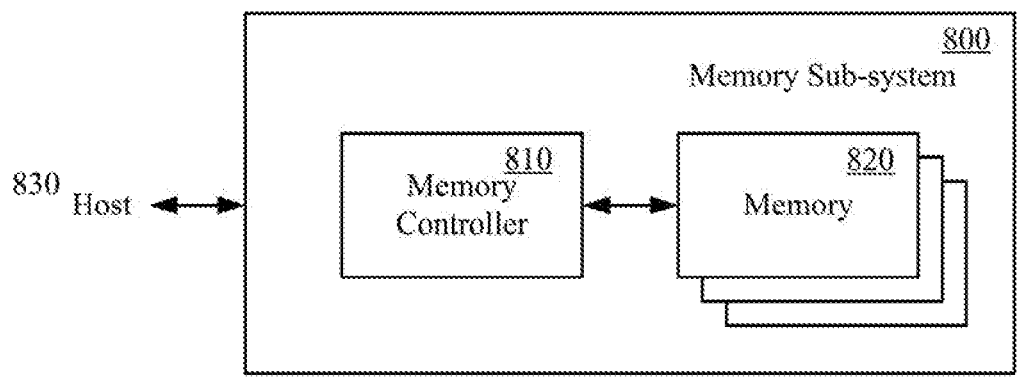
FIG. 8 shows a block diagram of a memory sub-system, in accordance with aspects of the present technology.

Referring now to FIG. 8, a block diagram of a memory sub-system, in accordance with aspects of the present technology, is shown. The memory sub-system 800 can include one or more memory controllers 810 and one or more memory devices 820. The memory sub-system 800 can be a memory expansion card, Solid State Drive (SSD), or the like that is configurable to be coupled to a host device 830 such as a cellular telephone, smart phone, e-reader, table personal computer (PC), laptop PC, desktop PC, gaming console, workstation, server computer, or other similar computing device. The memory sub-system 800 can be coupled to the host device 830 as in internal or external peripheral device.

The one or more memory controllers 810 can be operable to control access to data stored in the one or more memory devices 820 for use by the host device 830. The one or more memory controllers 810 can generate commands for reading and writing of data in the one or more memory devices 820 in response to memory requests received from the host device 830. One or more of the memory devices 820 can include the word line driver circuit as described herein with regard to FIGS. 2-4.

Figure 9:
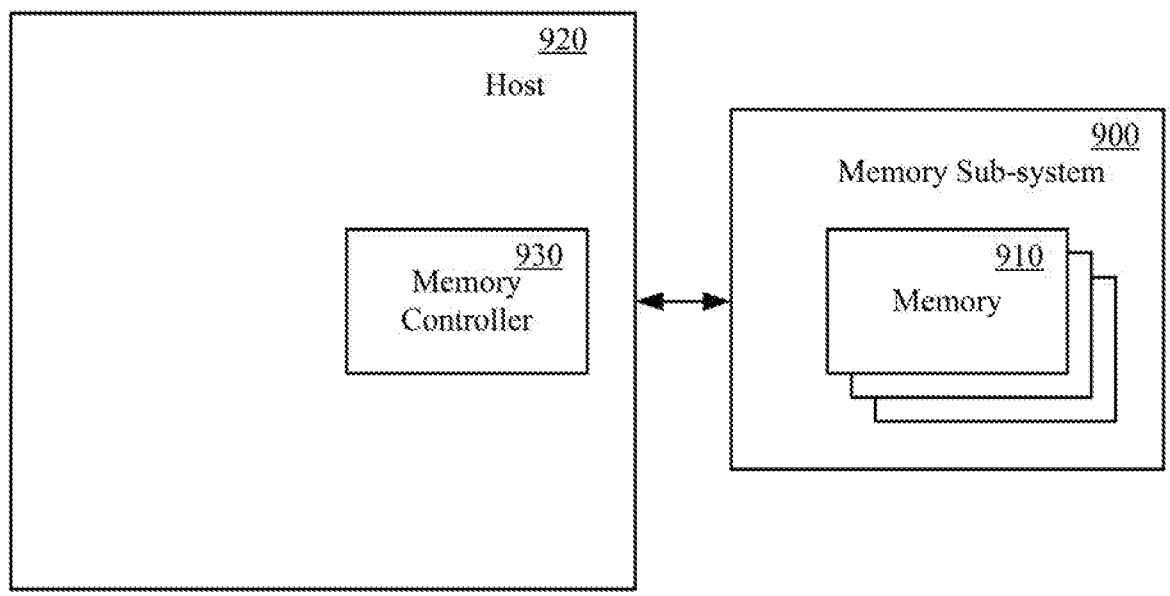
FIG. 9 shows a block diagram of a memory sub-system, in accordance with aspects of the present technology.

Referring now to FIG. 9, a block diagram of a memory sub-system, in accordance with aspects of the present technology, is shown. The memory sub-system 900 can include one or more memory devices 910. The memory sub-system 900 can be a memory expansion card, Solid State Drive (SSD), or the like that is configurable to be coupled to a host device 920 such as a cellular telephone, smart phone, e-reader, table personal computer (PC), laptop PC, desktop PC, gaming console, workstation, server computer, or other similar computing device. The host device 920 can include one or more memory controllers 930. The memory sub-system 900 can be coupled to the host device 920 as in internal or external peripheral device.

The one or more memory controllers 930 can be operable to control access to data stored in the one or more memory devices 910 for use by the host device 920. The one or more memory controllers 930 can generate commands for reading and writing of data in the one or more memory devices 910 in response to memory requests received from the host device 920. One or more of the memory devices can include the word line driver circuit 240 as described herein with regard to FIGS. 2-4.

The computing systems and memory sub-systems of FIG. 5-9 are illustrative of exemplary embodiments, and are not intended to limit aspects of the present technology. The word line driver circuit as described herein can be readily applied to any number of conventional memory devices, memory sub-systems, and/or computing systems, along with memory devices, memory sub-systems, and/or computing systems to be developed in the future.

The word line decoder and driver circuit in accordance with aspects of the present technology advantageously reduces delay in the word line driver circuit. In aspects, the address can be decoded and transfer to the level shifter latch as soon as the clock signal is received. The latching function is advantageously moved toward the end of the word line decoder and driver circuit. The delay of the word line decoder and driver circuit in accordance with aspects of the present technology can be the sum of the transmission gate delay and the propagation delay through the level shifter latch and word line driver (e.g., Ttr+Twdr), as compared to the sum of flip flop latch delay, the propagation delay through the address buffer, the propagation delay through the word line pre-decoder, the propagation delay through the word line decoder, and the propagation through the level shifter and word line driver (e.g., Tc→q+Tab+Twpd+Twd+Twdr). Aspects of the present technology also advantageously eliminate the use of a clocked flip flop, which can reduce the area of the word line decoder and driver circuit in the Integrated Circuit (IC) chip of the device.

The foregoing descriptions of specific aspects of the present technology have been presented for purposes of illustration and description. They are not intended to be exhaustive or to limit the invention to the precise forms disclosed, and obviously many modifications and variations are possible in light of the above teaching. The aspects were chosen and described in order to best explain the principles of the present technology and its practical application, to thereby enable others skilled in the art to best utilize the present technology and various aspects with various modifications as are suited to the particular use contemplated. It is intended that the scope of the invention be defined by the claims appended hereto and their equivalents.

What is claimed is:

1. A device comprising:
a first inverter including an input configured to receive a signal, wherein the first inverter operates from a first supply potential difference;
a second inverter including an input coupled to an output of the first inverter, wherein the second inverter operates from the first supply potential difference;
a first transmission gate including a control terminal configured to receive a pulse clock signal and an input coupled to the output of the first inverter, wherein the first transmission gate passes the signal from the output of the first inverter during a first logical state of the pulse clock signal;
a second transmission gate including a control terminal configured to receive the pulse clock signal and an input coupled to the output of the second inverter, wherein the second transmission gate passes the signal from the output of the second inverter during the first logical state of the pulse clock signal;
a latch including a third inverter cross coupled to a fourth inverter, wherein an input of the third inverter is coupled to an output of the first transmission gate and an output of the fourth inverter, wherein an input of the fourth inverter is coupled to an output of the second transmission gate and an output of the third inverter, and wherein the latch operates from a second supply potential difference that is greater than the first supply potential difference, and wherein the input of the third inverter and the input of the fourth inverter are driven at the same time by the signals passed by the respective first and second transmission gates in response to the pulse clock signal having the first logical state; and
an inverting driver including an input coupled to an output of the third inverter and an output configured to output a drive signal, wherein the inverting driver operates from the second supply potential difference.

2. The device of claim 1, wherein:
the first transmission gate includes a Metal Oxide Semiconductor Field Effect Transistor (MOSFET) including a gate configured to receive the clock signal, a source coupled to the output of the first inverter, and a drain coupled to the input of the third inverter; and
the second transmission gate includes a MOSFET including a gate configured to receive the clock signal, a source coupled to the output of the second inverter, and a drain coupled to an input of the fourth inverter.

3. The device of claim 1, wherein:
the third inverter includes a first p-MOSFET and a first n-MOFET, wherein a gate of the first p-MOSFET and a gate of the first n-MOSFET are coupled together as the input of the third inverter, a drain of the first p-MOSFET and a drain of the first n-MOSFET are coupled together as the output of the third inverter, a source of the first p-MOSFET and a source of the first n-MOSFET are coupled between the second supply potential; and
the fourth inverter includes a second p-MOSFET and a second n-MOSFET, wherein a gate of the second p-MOSFET and a gate of the second n-MOSFET are coupled together as the input of the fourth inverter, a drain of the second p-MOSFET and a drain of the second n-MOSFET are coupled together as the output of the fourth inverter, and a source of the second p-MOSFET and a source of the second n-MOSFET are coupled between the second supply potential.

4. The device of claim 1, wherein the inverting driver includes a p-MOSFET and a n-MOSFET, wherein a gate of the p-MOSFET and the gate of the n-MOSFET are coupled together as the input of the inverting driver, a source of the p-MOSFET and a source of the n-MOSFET are coupled together as the output of the inverting driver, and a drain of the p-MOSFET and a drain of the n-MOSFET are coupled between the second supply potential.

5. The device of claim 1, further comprising:
an address buffer configured to receive and buffer a plurality of address signals;
a word line pre-decoder configured to receive the buffered plurality of address signals and output partially decoded address signals; and
a word line decoder configured to receive the partially decoded address signals and output a plurality of decoded address signals, wherein the input of the first inverter is configured to receive one of the plurality of decoded address signals.

6. The device of claim 1, further comprising:
an array of memory cells arranged in columns and rows, wherein sets of a first number of cells arranged along columns are coupled to corresponding ones of a plurality of bit lines and sets of a second number of cells arranged along rows are coupled to corresponding ones of the plurality of word lines.

7. The device of claim 6, wherein each memory cell includes a select gate and a Magnetic Tunnel Junction (MTJ) coupled in series between a corresponding one of the plurality of bit lines and a corresponding one of the plurality of source lines, and wherein a control terminal of the select gate is coupled to a corresponding one of the plurality of word lines.

8. The device of claim 6, wherein the array of memory cells comprise an array of Spin Torque Magnetoresistive memory cells.

9. A memory device comprising:
a memory cell array including a plurality of word lines;
an address buffer configured to buffer a plurality of address signals, wherein the address buffer operates from a first supply potential difference;
an address decoder circuit configured to receive the buffered plurality of address signals and output a plurality of decoded address signals, wherein the address decoder operates from the first supply potential difference;
a first inverter including an input configured to receive a respective one of the decoded address signals, wherein the first inverter operates from the first supply potential difference;
a second inverter including an input coupled to an output of the first inverter, wherein the second inverter operates from the first supply potential difference;
a first transmission gate including a control terminal configured to receive a clock signal and an input coupled to the output of the first inverter, wherein the first transmission gate passes the signal from the output of the first inverter during a first logical state of the pulse clock signal;
a second transmission gate including a control terminal configured to receive the clock signal and an input coupled to the output of the second inverter, wherein the second transmission gate passes the signal from the output of the second inverter during the first logical state of the pulse clock signal;
a latch including a third inverter cross coupled to a fourth inverter, wherein an input of the third inverter is coupled to an output of the first transmission gate and an output of the fourth inverter, wherein an input of the fourth inverter is coupled to an output of the second transmission gate and an output of the third inverter, and wherein the latch operates from a second supply potential difference that is greater than the first supply potential difference, and wherein the input of the third inverter and the input of the fourth inverter are driven at the same time by the signals passed by the respective first and second transmission gates in response to the pulse clock signal having the first logical state; and
an inverting driver including an input coupled to an output of the third inverter and an output configured to output a drive signal on a corresponding one of the plurality of word lines, wherein the inverting driver operates from the second supply potential difference.

10. The memory device of claim 9, wherein the memory cell array comprises a Magnetoresistive memory cell array.

11. The memory device of claim 10, wherein the Magnetoresistive memory cell array includes a plurality of memory cells, and each memory cell includes a select gate and a Magnetic Tunnel Junction (MTJ) coupled in series between a corresponding one of the plurality of bit lines and a corresponding one of the plurality of source lines, and wherein a control terminal of the select gate is coupled to a corresponding one of the plurality of word lines.

12. The memory device of claim 9, wherein,
the respective one of plurality of decoded address signals includes a first state and a second state; and
the drive signal includes a third state and a fourth state, wherein a potential difference between the third state and the fourth state is the second supply potential difference and a potential difference between the first state and the second state is the first supply potential difference.

* * * * *